(12) United States Patent
Miyashita

(10) Patent No.: US 9,899,439 B2
(45) Date of Patent: Feb. 20, 2018

(54) IMAGE SENSOR INCLUDING MICRO-LENSES HAVING HIGH REFRACTIVE INDEX AND IMAGE PROCESSING SYSTEM INCLUDING THE SAME

(71) Applicant: SAMSUNG ELECTRONICS CO., LTD., Suwon-si (KR)

(72) Inventor: Naoyuki Miyashita, Hwaseong-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 64 days.

(21) Appl. No.: 14/842,066

(22) Filed: Sep. 1, 2015

(65) Prior Publication Data

US 2016/0079292 A1    Mar. 17, 2016

(30) Foreign Application Priority Data

Sep. 16, 2014  (KR) .......................... 10-2014-0122906

(51) Int. Cl.
| | | |
|---|---|---|
| *H04N 5/335* | (2011.01) | |
| *H01L 27/146* | (2006.01) | |
| *G02B 13/00* | (2006.01) | |
| *G02B 5/20* | (2006.01) | |
| *G02B 3/00* | (2006.01) | |

(52) U.S. Cl.
CPC ...... *H01L 27/14621* (2013.01); *G02B 3/0006* (2013.01); *G02B 5/201* (2013.01); *G02B 13/0085* (2013.01); *H01L 27/1463* (2013.01); *H01L 27/1464* (2013.01); *H01L 27/14627* (2013.01); *H01L 27/14643* (2013.01)

(58) Field of Classification Search
CPC .................................................. H04N 5/2254
USPC .................................................. 348/294, 273
See application file for complete search history.

(56) References Cited

U.S. PATENT DOCUMENTS

| | | | |
|---|---|---|---|
| 8,743,265 B2* | 6/2014 | Toumiya | ........... H01L 27/14605 |
| | | | 348/294 |
| 2006/0033176 A1 | 2/2006 | Mun | |
| 2006/0145197 A1 | 7/2006 | Baek | |
| 2008/0315074 A1 | 12/2008 | Konno et al. | |
| 2010/0053387 A1 | 3/2010 | Kim et al. | |

(Continued)

FOREIGN PATENT DOCUMENTS

| | | |
|---|---|---|
| JP | 2002-6111 A | 1/2002 |
| JP | 2006-286891 A | 10/2006 |

(Continued)

*Primary Examiner* — Joel Fosselman
(74) *Attorney, Agent, or Firm* — Sughrue Mion, PLLC

(57) ABSTRACT

Provided are an image sensor with micro-lenses having a high refractive index and an image processing system including the same. The image sensor includes: a semiconductor substrate in which a photoelectric conversion device is formed; at least one color filter formed on the semiconductor substrate; at least one color filter fence formed on the semiconductor substrate and between two neighboring color filters among the at least one color filter; and at least one micro-lens formed on the color filter, respectively. The micro-lens has a first refractive index equal to or greater than a first threshold. The filter fence has a second refractive index less than or equal to a second threshold. The second threshold is less than the first threshold.

20 Claims, 6 Drawing Sheets

(56) References Cited

U.S. PATENT DOCUMENTS

| | | | |
|---|---|---|---|
| 2013/0100324 A1* | 4/2013 | Ogino | H01L 27/14621 |
| | | | 348/294 |
| 2013/0134537 A1 | 5/2013 | Nakajiki et al. | |
| 2013/0334642 A1 | 12/2013 | Masuda | |

FOREIGN PATENT DOCUMENTS

| | | |
|---|---|---|
| JP | 2007-208059 A | 8/2007 |
| KR | 2000-0039542 A | 7/2000 |
| KR | 10-2001-0037841 A | 5/2001 |
| KR | 10-2004-0060508 A | 7/2004 |
| KR | 10-2007-0081702 A | 8/2007 |
| KR | 10-2009-0061199 A | 6/2009 |

* cited by examiner

IMAGE SENSOR INCLUDING MICRO-LENSES HAVING HIGH REFRACTIVE INDEX AND IMAGE PROCESSING SYSTEM INCLUDING THE SAME

CROSS-REFERENCE TO RELATED APPLICATION

This application claims priority from Korean Patent Application No. 10-2014-0122906, filed on Sep. 16, 2014, in the Korean Intellectual Property Office, the disclosure of which is incorporated herein in its entirety by reference.

BACKGROUND

Apparatuses and methods consistent with exemplary embodiments of the inventive concept relate to an image sensor, and more particularly, to an image sensor including micro-lenses having a high refractive index and an image processing system including the same.

An image sensor is a device that converts an optical image into an electric signal. The image sensor can be used in digital cameras or various image processing apparatuses having a digital camera function.

Image sensors may be classified into a charged-coupled device (CCD) image sensor and a complementary metal-oxide-semiconductor (CMOS) image sensor.

An image sensor includes a plurality of pixels arranged in a matrix. Each of the plurality of pixels includes a photo-electric conversion module configured to convert incident light into electric signals, and a plurality of transistors configured to read out the electric signals from the photo-electric conversion device.

Recently, with a demand for high-resolution images, pixels of image sensors have become decreased in size. Thus, the sizes of the existing pixels are far larger than the wavelength of light, but the sizes of small-sized pixels may be substantially the same as the wavelength of light.

However, the sensitivity of small-sized pixels may be lower than that of large-sized pixels.

SUMMARY

Exemplary embodiments of the inventive concept provide an image sensor including small-sized pixels and capable of improving the sensitivity thereof by increasing a refractive index using micro-lenses, and an image processing system including the same.

The exemplary embodiments of the inventive concept also provide an image sensor including small-sized pixels and capable of reducing cross-talk caused by color filters, and an image processing system including the same.

According to an aspect of an exemplary embodiment, there is provided an image sensor which may include: a substrate in which a photoelectric conversion device is formed; at least one color filter formed on the semiconductor substrate; at least one micro-lens formed on the color filter, respectively, wherein the micro-lens has a refractive index equal to or greater than a threshold which is greater than a refractive index of the color filter.

The refractive index of the micro-lens may be in a range of 1.8 to 2.5, and the refractive index of the color filter may be in a range of 1.5 to 1.7.

The color filter may include a plurality of different color filters having respectively different refractive indexes. In this case, the threshold of the refractive index of the micro-lens may be a sum of a threshold difference and a refractive index of a color filter, among the plurality of different color filters, which is the highest among the different refractive indexes.

The micro-lens may include at least one selected from the group consisting of metal-added resin, silicon nitride (SiN), plasma silicon oxide (P—SiO), zinc oxide (ZnO), hafnium oxide (HfO), tantalum oxide (TaO), niobium oxide (NbO), zirconium oxide (ZrO), and titanium oxide (TiO).

According to an aspect of an exemplary embodiment, there is provided an image sensor module which may include: the above image sensor constituted by a plurality of pixels for generating a plurality of pixel signals according to incident light; and a signal processing circuit configured to output image data based on the plurality of pixel signals.

According to an aspect of an exemplary embodiment, there is provided an image processing system which may include the above image sensor module configured to output image data and a processor configured to process the image data.

According to an aspect of an exemplary embodiment, there is provided an image sensor which may include: a semiconductor substrate in which a photoelectric conversion device is formed; at least one color filter formed on the semiconductor substrate; at least one color filter fence formed on the semiconductor substrate and between two neighboring color filters among the at least one color filter; and at least one micro-lens formed on the color filter, respectively.

The micro-lens may have a first refractive index equal to or greater than a first threshold. The color filter fence may have a second refractive index less than or equal to a second threshold. The second threshold may be less than the first threshold.

According to an aspect of an exemplary embodiment, there is provided an image sensor module which may include: the above image sensor constituted by a plurality of pixels for generating a plurality of pixel signals according to incident light; and a signal processing circuit configured to output image data based on the plurality of pixel signals.

According to an aspect of an exemplary embodiment, there is provided an image processing system which may include the above image sensor module configured to output image data and a processor configured to process the image data.

The micro-lens may include at least one selected from the group consisting of metal-added resin, silicon nitride (SiN), plasma silicon oxide (P—SiO), zinc oxide (ZnO), hafnium oxide (HfO), tantalum oxide (TaO), niobium oxide (NbO), zirconium oxide (ZrO), and titanium oxide (TiO).

The first refractive index may be in a range of 1.8 to 2.5, and the second refractive index may be in a range of 1.0 to 1.3.

The image sensor may further include: a first flat layer formed on the color filter and below the micro-lens; and a second flat layer formed on the semiconductor substrate and below the color filter.

The first refractive index of the micro-lens may be greater than a refractive index of the color filter, and the refractive index of the color filter may be greater by a threshold difference or more than the second refractive index of the color filter fence.

The threshold difference may be in a range of 0.2 to 0.4, and

The refractive index of the color filter may be in a range of 1.5 to 1.7.

The color filter fence may include a porous silica material or an air layer.

According to an aspect of an exemplary embodiment, there is provided an image processing system which may include: the above image sensor configured to output image data; and a processor configured to process the image data.

The color filter may include a plurality of different color filters having respectively different refractive indexes. In this case, the first threshold may be a sum of a first threshold difference and a refractive index of a color filter, among the plurality of different color filters, which is the highest among the different refractive indexes.

The second threshold may be less, by a second threshold difference, than a refractive index of a color filter, among the plurality of color filters, which is the lowest among the different refractive indexes.

BRIEF DESCRIPTION OF THE DRAWINGS

Exemplary embodiments of the inventive concept will be more clearly understood from the following detailed description taken in conjunction with the accompanying drawings, in which.

DETAILED DESCRIPTION OF THE EXEMPLARY EMBODIMENTS

Figure 1:
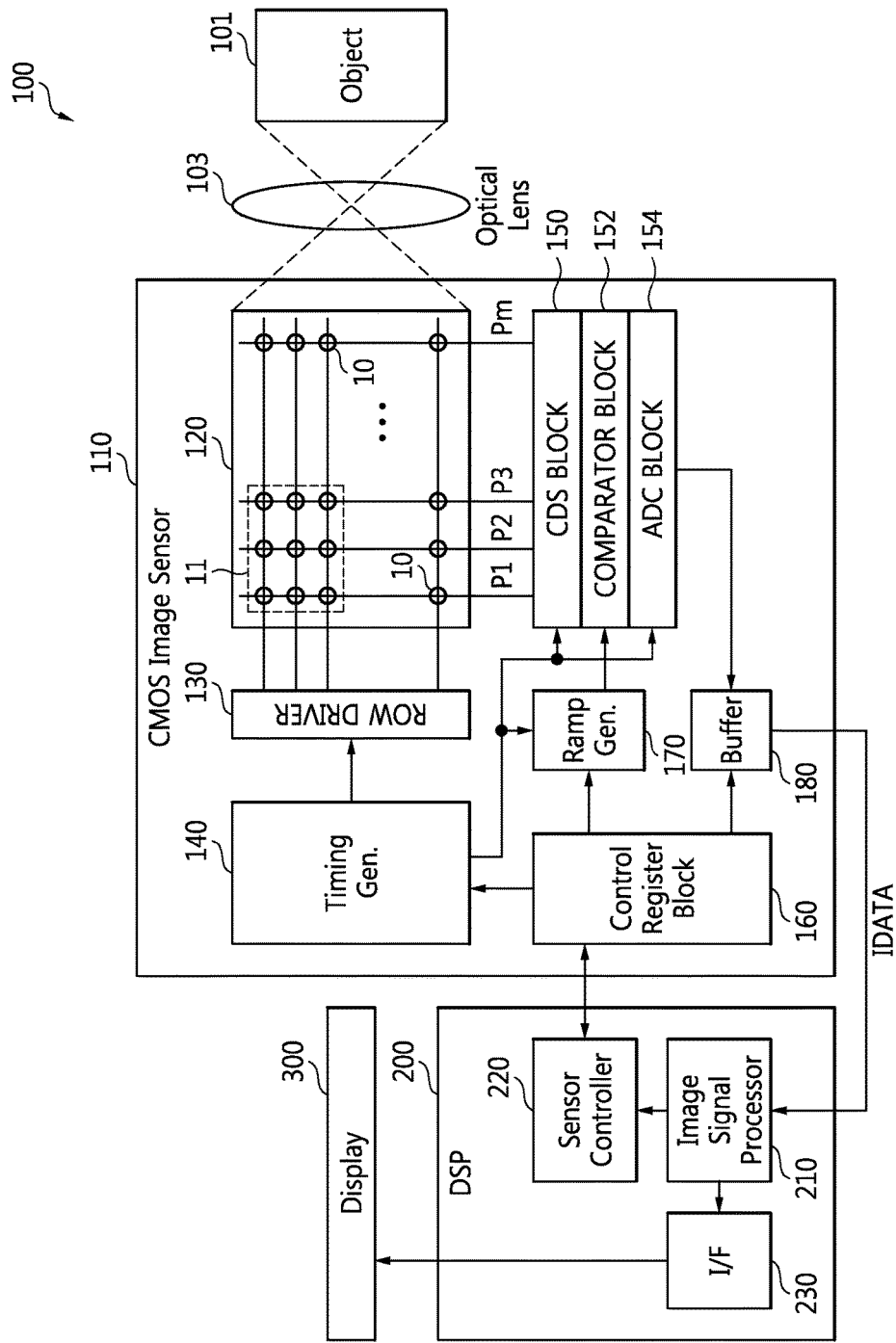
FIG. 1 is a schematic block diagram of an image processing system, according to an exemplary embodiment.

The inventive concept now will be described more fully hereinafter with reference to the accompanying drawings, in which exemplary embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will also be understood that when a layer is referred to as being "on" another layer or substrate, it can be directly on the other layer or substrate, or intervening layers may also be present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic block diagram of an image processing system 100 according to an exemplary embodiment of the inventive concept.

The image processing system 100 of FIG. 1 may be a portable electronic apparatus.

The portable electronic apparatus may be a laptop computer, a mobile phone, a smart phone, a tablet personal computer (PC), a personal digital assistant (PDA), an enterprise digital assistant (EDA), a digital still camera, a digital video camera, a portable multimedia player (PMP), a personal/portable navigation device (PND), a mobile internet device (MID), a wearable computer, an Internet-of-things (IoT) apparatus, or an Internet-of-everything (IoE) apparatus.

The image processing system 100 includes an optical lens 103, an image sensor 110, a digital signal processor (DSP) 200, and a display 300.

The image sensor 110 generates image data IDATA of an object 101 photographed using the optical lens 103. For example, the image sensor 110 may be a complementary metal-oxide-semiconductor (CMOS) image sensor or a CMOS image sensor chip The image sensor 110 may be configured to have a backside illumination (BSI) structure or a front side illumination (FSI) structure.

The image sensor 110 may include a pixel array (or active pixel sensor array) 120, a row driver 130, a timing generator 140, a correlated double sampling (CDS) block 150, a comparator block 152, and an analog-to-digital conversion (ADC) block 154, a control register block 160, a ramp signal generator 170, and a buffer 180.

The image sensor 110 of FIG. 1 is merely an example of an image sensor illustrated for convenience of explanation, and thus, a particular structure of the image sensor 110 may vary according to a manufacturer.

The pixel array 120 includes a plurality of pixels 10 arranged in a matrix. The structure and operation of each of the plurality of pixels 10 will be described in detail with reference to FIGS. 1 to 6 below.

The row driver 130 may transmit a plurality of control signals for controlling operations of the plurality of pixels 10 to the pixel array 120, under control of the timing generator 140. For example, the row driver 130 may control the operations of the plurality of pixels in units of rows.

The timing generator 140 may control operations of the row driver 130, the CDS block 150, the ADC block 154, and the ramp signal generator 170, under control of the control register block 160.

The CDS block 150 may perform CDS on pixel signals P1 to Pm output from a plurality of respective column lines of the pixel array 120. Here, 'm' denotes a natural number.

The comparator block 152 may compare a plurality of correlated double-sampled pixel signals output from the CDS block 150 with a ramp signal output from the ramp signal generator 170, and output a plurality of comparison signals according to a result of comparing the plurality of correlated double-sampled pixel signals with the ramp signal.

The ADC block 154 may convert the plurality of comparison signals received from the comparator block 152 into a plurality of digital signals, respectively, and output the plurality of digital signals to the buffer 180.

The control register block 160 may control operations of the timing generator 140, the ramp signal generator 170, and buffer 180, under control of the DSP 200.

The buffer 180 may transmit image data IDATA corresponding to the plurality of digital signals output from the ADC block 154 to the DSP 200.

The DSP 200 includes an image signal processor (ISP) 210, a sensor controller 220, and an interface 230. For example, the DSP 200 may perform a function of a processor capable of controlling an operation of the image sensor 110.

The ISP 210 may control the sensor controller 220 that controls the control register block 160, and the interface 230.

In one exemplary embodiment, the image sensor 110 and the DSP 200 may be each embodied as a chip, and form one packet, e.g., a multi-chip package (MCP), together. In another exemplary embodiment, the image sensor 110 and the ISP 210 may be each embodied as a chip, and form one packet, e.g., an MCP, together.

The ISP 210 may process the image data IDATA transmitted from the buffer 180 and transmit the processed image data IDATA to the interface 230.

The sensor controller 220 may generate various control signals for controlling the control register block 160, under control of the ISP 210.

The interface 230 may transmit the image data IDATA processed by the ISP 210 to the display 300. The display 300 may display the processed image data IDATA received from the interface 230. For example, the display 300 may be a thin-film transistor-liquid crystal display (TFT-LCD), a light-emitting diode (LED) display, an organic LED (OLED) display, or an active-matrix OLED (AMOLED) display.

Figure 2:
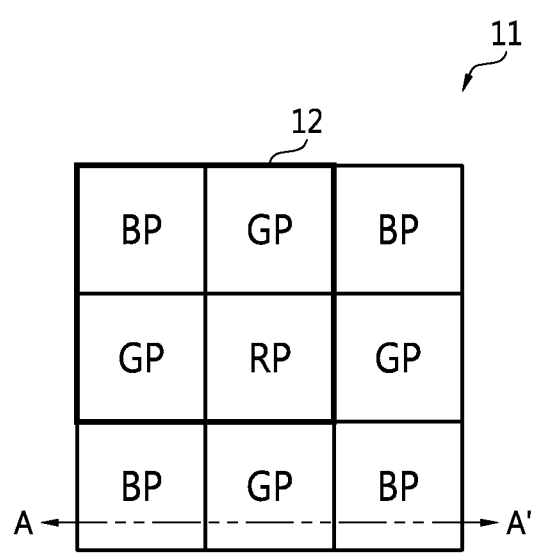
FIG. 2 is a plan view of 3×3 pixels included in a pixel array of FIG. 1, according to an exemplary embodiment.

FIG. 2 is a plan view of 3×3 pixels 11 included in the pixel array 120 of FIG. 1. FIG. 2 illustrates only the 3×3 pixels 11 which are a part of the pixel array 120 for convenience of explanation, but the other pixels of the pixel array 120 may have substantially the same structure as the 3×3 pixels 11.

The 3×3 pixels 11 of FIG. 2 may include red pixels RP, green pixels GP, and blue pixels BP arranged in a Bayer pattern. However, exemplary embodiments of the inventive concept are not limited to the above pixels of the Bayer pattern, and the 3×3 pixels 11 are not limited to the red pixels RP, the green pixels GP, and the blue pixels RP. For example, in another exemplary embodiment, the 3×3 pixels 11 may be other color pixels such as magenta pixels, yellow pixels, and cyan pixels.

The pixels RP, GP, and BP each include a color filter corresponding thereto.

For example, although not shown, the blue pixels RP may each include a blue filter, the green pixels GP may each include a green filter, and the red pixels RP may each include a red filter.

Figure 3:
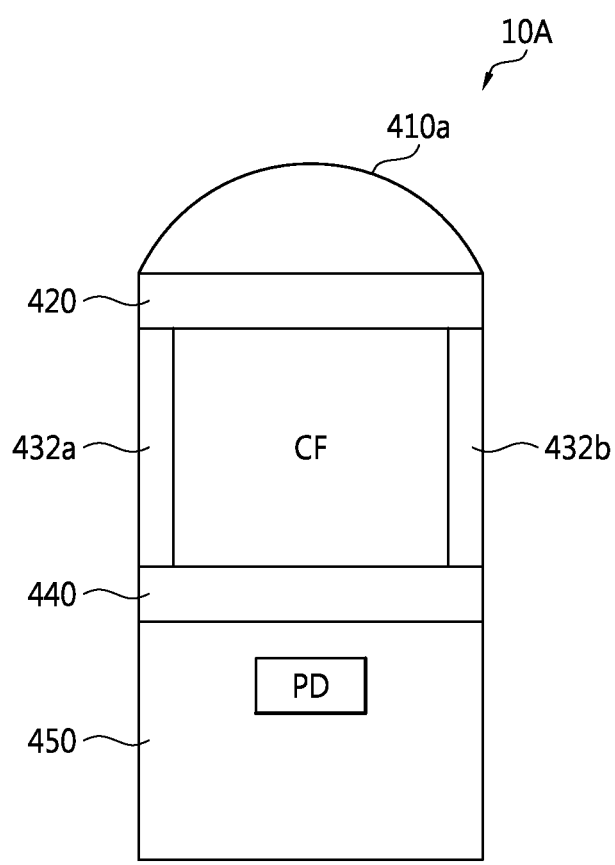
FIG. 3 is a cross-sectional view of a pixel such as shown that in FIG. 2, according to an exemplary embodiment.

FIG. 3 is a cross-sectional view of a pixel 10A such as shown that in FIG. 2. That is, FIG. 3 illustrates a cross-section of one of the 3×3 pixels 11 illustrated in FIG. 2.

Referring to FIGS. 1 to 3, the pixel 10A may include a micro-lens 410a, a first flat layer 420, a color filter CF, a second flat layer 440 and a semiconductor substrate 450.

A photoelectric conversion module PD is formed in the semiconductor substrate 450.

The photoelectric conversion module PD may be a photodiode, a phototransistor, a photogate, or a pinned photodiode.

The color filter CF is formed on or over the semiconductor substrate 450.

The color filter CF may selectively transmit light having a specific wavelength (e.g., red, green, blue, magenta, yellow, or cyan light) to pass therethrough.

In the embodiment of FIG. 3, the second flat layer 440 is formed on the semiconductor substrate 450 and below the color filter CF, i.e., between the color filter CF and the semiconductor substrate 450.

The micro-lens 410a is formed on the color filter CF.

For example, the micro-lens 410a may be formed on an upper portion of the pixel 10A, and used to improve the quality of an image by increasing light-gathering power. Here, it is assumed that a location on the pixel 10A at which incident light first arrives is the upper portion of the pixel 10A.

In the embodiment of FIG. 3, the first flat layer 420 is formed on the color filter CF and below the micro-lens 410, i.e., between the color filter CF and the micro-lens 410.

The first flat layer 420 and the second flat layer 440 may prevent incident light that is incident via the micro-lens 410 and the color filter CF from being reflected. That is, the first flat layer 420 and the second flat layer 440 may efficiently transmit incident light to pass therethrough, thereby improving the performance (e.g., the light-receiving efficiency and photosensitivity) of the image sensor 100.

Incident light having a specific wavelength which passes through the micro-lens 410 and the color filter CF may be incident on the photoelectric conversion device PD, and the photoelectric conversion device PD generates electric charges from the incident light having the specific wavelength.

The pixel 10A is a small-sized pixel, and thus, the micro-lens 410 has a low radius of curvature (ROC). For example, the ROC of the micro-lens 410 may be 0.7 μm to 1.1 μm but is not limited thereto.

The micro-lens 410 has a high refractive index (RI) equal to or greater than a first threshold so as to increase light-gathering power. The RI of the micro-lens 410 is greater than that of the color filter CF. For example, the RI of the micro-lens 410 may be 1.8 to 2.5 but is not limited thereto.

To increase the RI of the micro-lens 410, the micro-lens 410 may be formed by adding a metal, e.g., titanium (Ti), to a resin material, or may be formed of at least one selected from the group consisting of silicon nitride (SiN), plasma silicon oxide (P—SiO), zinc oxide (ZnO), hafnium oxide (HfO), tantalum oxide (TaO), niobium oxide (NbO), zirconium oxide (ZrO), and titanium oxide (TiO).

In one exemplary embodiment, the micro-lens 410 may be formed by adding titanium (Ti) to a resin material. In this case, the micro-lens 410 may have an RI of about 1.8 to 2.0. In another exemplary embodiment, the micro-lens 410 may be formed of plasma silicon oxide (P—Sio) and have an RI of about 1.9 in this case.

In another exemplary embodiment, the micro-lens 410 may be formed of zinc oxide (ZnO) and have an RI of about 1.95 in this case.

In another exemplary embodiment, the micro-lens 410 may be formed of hafnium oxide (HfO) and have an RI of about 2.0 in this case.

In another exemplary embodiment, the micro-lens 410 may be formed of tantalum oxide (TaO) and have an RI of about 2.1 in this case.

In another exemplary embodiment, the micro-lens 410 may be formed of niobium oxide (NbO) and may have an RI of about 2.3 in this case.

In another exemplary embodiment, the micro-lens 410 may be formed of zirconium oxide (ZnO) and may have an RI of about 2.4 in this case.

In another exemplary embodiment, the micro-lens 410 may be formed of titanium oxide (TiO) and may have an RI of about 2.5 in this case.

The first threshold may be determined by the RI of the color filter CF. For example, the first threshold may be a value obtained by adding a first threshold difference to the RI of a color filter (e.g., a red filter) which is the highest among the RIs of color filters CF.

According to an exemplary embodiment of the inventive concept, incident light may be concentrated on a photoelectric conversion device PD of a target pixel as much as possible by refracting the incident light to a great extent by using the micro-lens 410 having a high RI.

In one exemplary embodiment, the first and second flat layers 420 and 440 may have the same RI as the micro-lens 410 but is not limited thereto.

A process of forming the first and second flat layers 420 and 440 to have the same RI as the micro-lens 410 may be simpler than a process of forming the first and second flat layers 420 and 440 to have different RIs than that of the micro-lens 410.

Light passing through the micro-lens 410 passes through the color filter CF, and is then incident on a photoelectric conversion device PD of a target pixel in the semiconductor substrate 450. However, some of the light may be diffracted by the color filter CF, and be then incident on a photoelectric conversion device PD of another pixel. Thus, cross-talk may occur between pixels.

Thus, color filter fences 432a and 432b are formed close to the color filter CF to reduce an amount of light to be diffracted by the color filter CF so as to reduce cross-talk between pixels.

The color filter fences 432a and 432b have an RI which is less than or equal to a second threshold. For example, the RIs of the color filter fences 432a and 432b may be 1.0 to 1.3 but are not limited thereto.

The second threshold may be less than the first threshold and be determined by the RI of the color filter CF. For example, the second threshold may be a value obtained by subtracting a second threshold difference from an RI of a color filter (e.g., a blue filter) which is the lowest among the RIs of the color filters CF.

The second threshold difference may be in a range of 0.2 to 0.4 but is not limited thereto. The RI of the color filter may be in a range of 1.5 to 1.7.

The greater the second threshold difference, i.e., the greater the difference between the RI of the color filter CF and the RIs of the color filter fences 432a and 432b, the better the functions of the color filter fences 432a and 432b for reducing an amount of light to be diffracted.

In one exemplary embodiment, the color filter fences 432a and 432b may be formed of a porous silica material so that they may have a low RI. In another exemplary embodiment, the color filter fences 432a and 432b may include an air layer.

Figure 4:
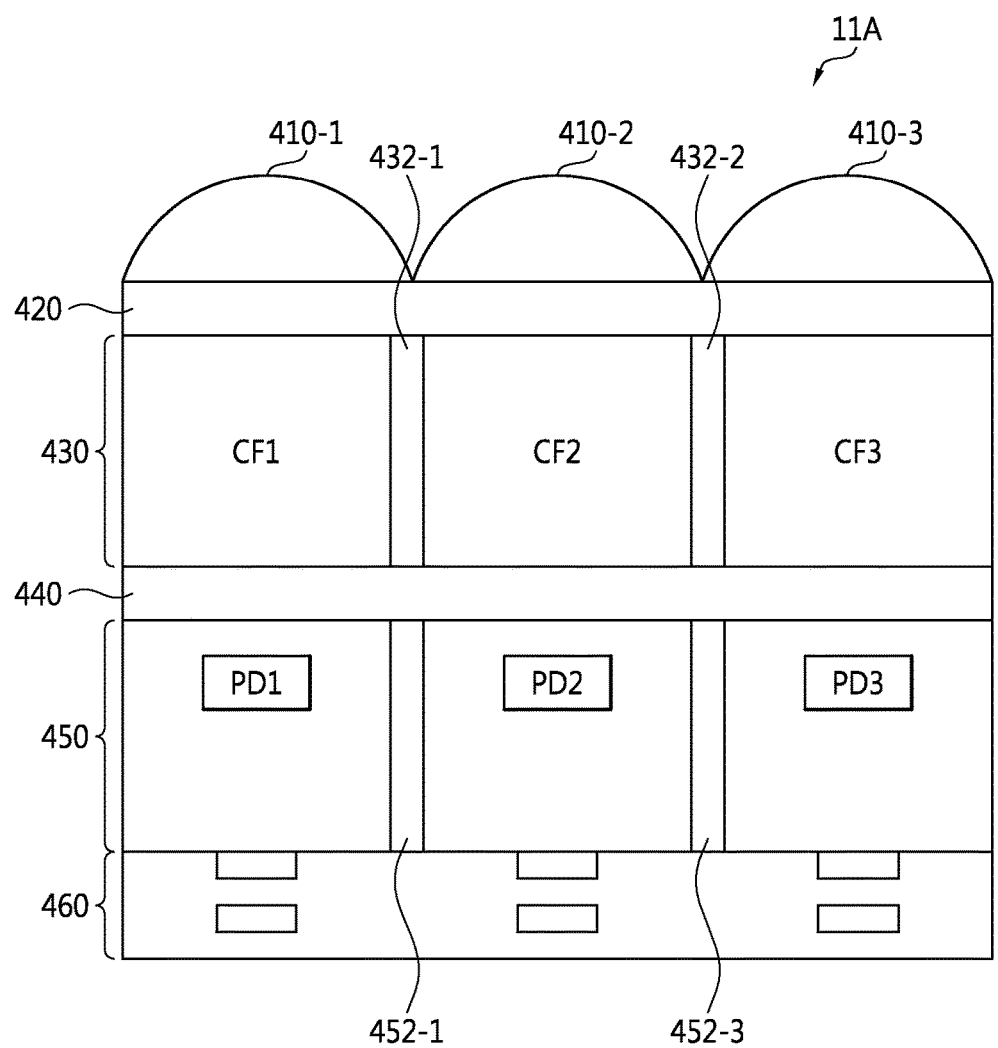
FIG. 4 is a cross-sectional view of the pixels of FIG. 2 taken along line A-A', according to an exemplary embodiment.

FIG. 4 is a cross-sectional view of the 3×3 pixels 11 of FIG. 2 taken along line A-A' according to an exemplary embodiment of the inventive concept. It may be understood that FIG. 4 illustrates a case in which a vertical cross-section of the pixel 10A of FIG. 3 is expanded to vertical cross-sections of three pixels.

Referring to FIGS. 1 to 4, pixels 11A may include first to third pixels. The first and third pixels may be blue pixels BP and the second pixel may be a green pixel GP.

The pixels 11A may include micro-lens 410-1, 410-2, 410-3, a first flat layer 420, a color filter layer 430, a second flat layer 440, a semiconductor substrate 450, and a wiring layer 460. The pixels 11A may further include color filter fences 432-1 and 432-2 formed between one color filter and a neighboring color filter.

The micro-lens 410-1, 410-2, and 410-3 may be formed on upper portions of the pixels 11A, respectively, and the first flat layer 420 may be formed below or under the micro-lens 410-1, 410-2, and 410-3. Here, it is assumed that locations on the pixels 11A at which incident light first arrives are the upper portions of the pixels 11A.

The color filter layer 430 may be formed below or under the first flat layer 420. The second flat layer 440 may be formed below or under the color filter layer 430. The semiconductor substrate 450 may be formed below or under the second flat layer 440.

The color filter layer 430 may include first to third color filters CF1, CF2, and CF3, a first color filter fence 432-1 formed between the first and second color filters CF1 and CF2, and a second color filter fence 432-2 formed between the second and third color filters CF2 and CF3.

The structures and operations of the micro-lens 410-1, 410-2, 410-3, the first flat layer 420, the color filters CF1, CF2, and CF3, the color filter fence 432-1 and 431-2, and the second flat layer 440 are as described above with reference to FIG. 3, and are thus not described again here.

The semiconductor substrate 450 may include first to third photoelectric conversion devices PD1 to PD3, a first trench 452-1, and a second trench 452-3.

The first to third photoelectric conversion devices PD1 to PD3 may accumulate photocharges generated according to the intensities of incident lights passing through the micro-lens 410-1, 410-2, and 410-3, respectively.

Each of the first to third photoelectric conversion devices PD1 to PD3 may be formed as n-type regions in a P-well (not shown) by performing an ion implantation process.

In the exemplary embodiment of FIG. 4, the first to third photoelectric conversion device PD1 to PD3 are included in the semiconductor substrate 450 but the locations and areas of the first to third photoelectric conversion device PD1 to PD3 may be changed.

Each of the first trench 452-1 and the second trench 452-3 may be formed by performing a trench process. The trench process is performed to form a trench having an appropriate depth in the semiconductor substrate 450. The trench process may be classified into a deep trench isolation (DTI) process of forming a trench having a relatively deep depth and a shallow trench isolation (STI) process of forming a trench having a relatively shallow depth. That is, each of the first trench 452-1 and the second trench 452-3 may be a DTI formed using the DTI process or an STI formed using the STI process.

Although not shown, transistors may be formed on the semiconductor substrate 450 to read out an electric signal from the first to third photoelectric conversion devices PD1 to PD3, respectively.

The wiring layer 460 may include gates of the transistors and multilayer conductive lines.

Figure 5:
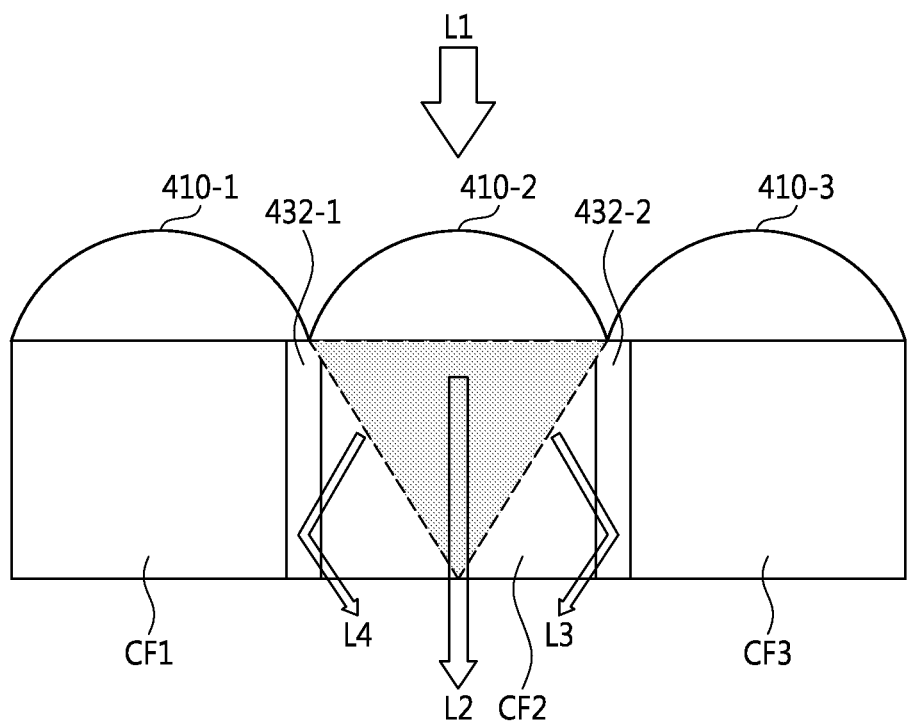
FIG. 5 is a conceptual diagram illustrating an operation of the pixels of FIG. 4, according to an exemplary embodiment.

FIG. 5 is a conceptual diagram illustrating operations of the pixels 11A of FIG. 4, according to an exemplary embodiment of the inventive concept.

Since the operations of the first to third pixels are substantially the same, the second pixel will be described below. The second micro-lens 410-2 on the second color filter CF2 has a high RI greater than that of the second color filter CF2, and thus, refracts incident light L1 to be concentrated on a photoelectric conversion module formed on or close to a surface of a semiconductor substrate below the second color filter CF2. Thus, a light-receiving rate of the photoelectric conversion module may increase to improve the sensitivity of an image sensor.

The first color filter fence 432-1 formed between the first and second color filters CF1 and CF2, and the second color filter fence 432-2 formed between the second and third color filters CF2 and CF3 reflect the incident light L1 not to be diffracted and incident on an undesired pixel.

Accordingly, cross-talk between pixels may decrease.

Figure 6:
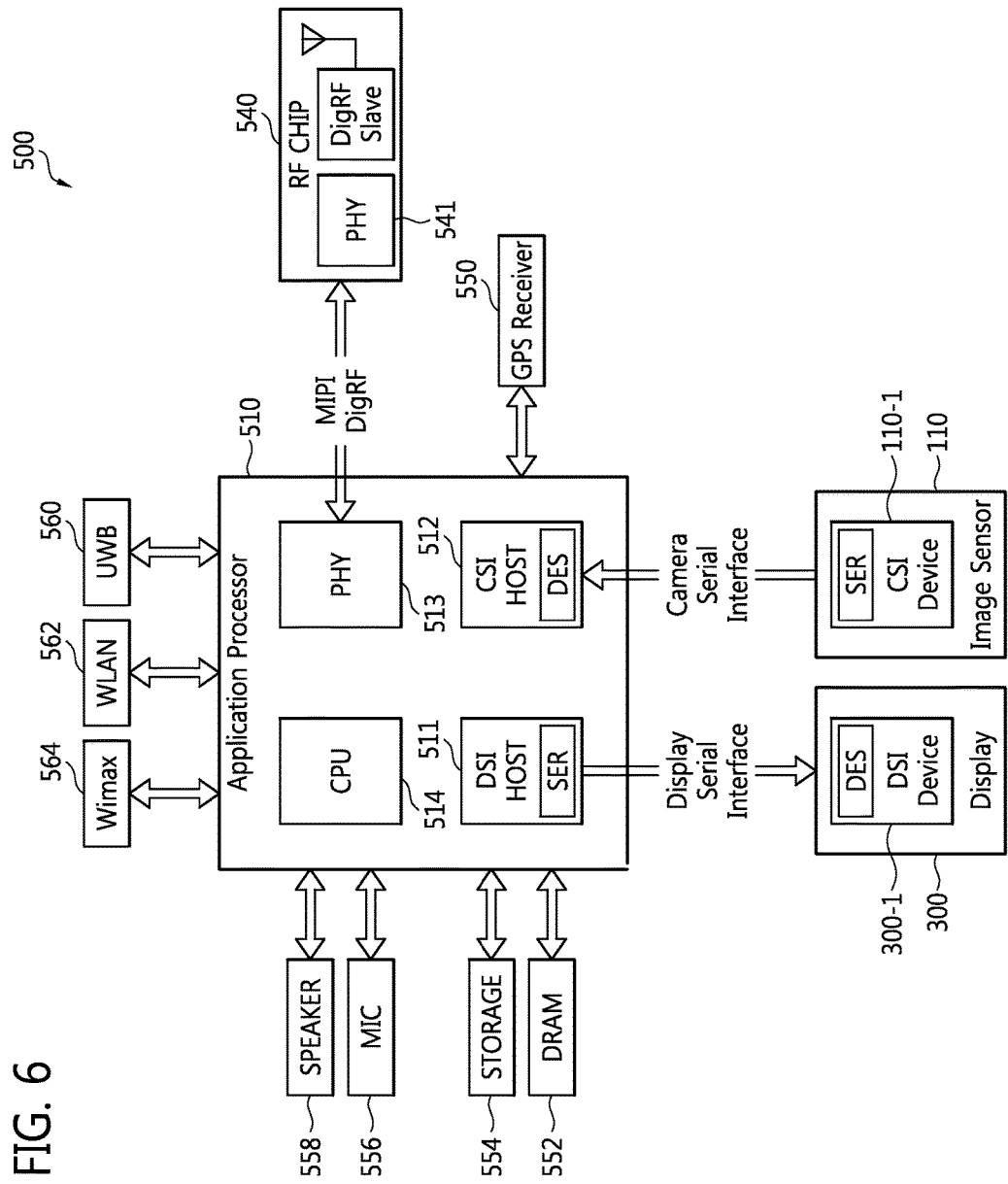
FIG. 6 is a schematic block diagram of an image processing system 500 according to other exemplary embodiments.

FIG. 6 is a schematic block diagram of an image processing system 500 according to other exemplary embodiments of the inventive concept. Referring to FIGS. 1 through 6, the image processing system 500 may use or support mobile industry processor interface (MIPI).

Like the image processing system 100 illustrated in FIG. 1, the image processing system 500 may be implemented as a portable electronic device. The image processing system 500 includes an application processor (AP) 510, the image sensor 110, and the display 300.

A camera serial interface (CSI) host 512 in the AP 510 may perform serial communication with a CSI device 110-1 in the image sensor 110 through CSI. A deserializer DES and a serializer SER may be included in the CSI host 512 and the CSI device 110-1, respectively. The image sensor 110 may be an image sensor described with reference to FIGS. 1 through 5.

A display serial interface (DSI) host 511 in the AP 510 may perform serial communication with a DSI device 300-1 in the display 300 through DSI. A serializer SER and a deserializer DES may be included in the DSI host 511 and the DSI device 300-1, respectively. The serializers SER and the deserializers DES may transfer electrical signals or optical signals. The image processing system 500 may also include a radio frequency (RF) chip 540 communicating with the AP 510. A physical layer (PHY) 513 in the AP 510 and a PHY 541 in the RF chip 540 may communicate data with each other according to MIPI DigRF standard.

A central processing unit (CPU) 514 in the AP 510 may control the operations of the DSI host 511, the CSI host 512, and the PHY 513. The CPU 514 may include at least one core. The AP 510 may be implemented in an integrated circuit (IC) or a system on chip (SoC). The AP 510 may be a processor or a host that can control the operations of the image sensor 110.

The image processing system 500 may further include a global positioning system (GPS) receiver 550, a volatile memory 552 such as dynamic random access memory (DRAM), a data storage 554 formed using non-volatile memory such as flash-based memory, a microphone (MIC) 556, and/or a speaker 558. The data storage 554 may be implemented as an external memory detachable from the AP 510. The data storage 554 may also be implemented as a universal flash storage (UFS), a multimedia card (MMC), an embedded MMC (eMMC), or a memory card.

The image processing system 500 may communicate with external devices using at least one communication protocol or standard, e.g., ultra-wideband (UWB) 560, wireless local area network (WLAN) 562, worldwide interoperability for microwave access (Wimax) 564, or long term evolution (LTE) (not shown). In other embodiments, the image processing system 500 may also include a near field communication (NFC) module, a WiFi module, or a Bluetooth module.

According to the above exemplary embodiments of the inventive concept, in an image sensor with small-sized pixels, light incident on a micro-lens may be concentrated on a photoelectric conversion device by increasing a refractive index of the micro-lens, thereby improving a light-receiving rate and sensitivity of the image sensor.

According to the above exemplary embodiments of the inventive concept, in an image sensor with small-sized pixels, light incident on a color filter may be effectively prevented from being diffracted and incident on an undesired pixel by using a color filter fence having a low RI, thereby decreasing cross-talk between pixels.

While the inventive concept has been particularly shown and described with reference to exemplary embodiments thereof, it will be understood that various changes in form and details may be made therein without departing from the spirit and scope of the following claims.

What is claimed is:

1. An image sensor comprising:
   a semiconductor substrate in which a photoelectric conversion device is formed;
   at least one color filter formed on the semiconductor substrate;
   a first flat layer formed on the at least one color filter;
   at least one micro-lens formed on the first flat layer,
   wherein the at least one micro-lens has a first refractive index equal to or greater than a threshold which is greater than a second refractive index of the at least one color filter, and
   wherein a third refractive index of the first flat layer is equal to the first refractive index.

2. The image sensor of claim 1, wherein the first refractive index of the at least one micro-lens is in a first range of 1.8 to 2.5, and
   wherein the second refractive index of the at least one color filter is in a second range of 1.5 to 1.7.

3. The image sensor of claim 1, further comprising:
   a second flat layer formed on the semiconductor substrate and below the at least one color filter.

4. The image sensor of claim 3, wherein a fourth refractive index of the second flat layer is equal to the first refractive index of the at least one micro-lens.

5. An image sensor comprising:
   a semiconductor substrate in which a photoelectric conversion device is formed;

at least one color filter formed on the semiconductor substrate;

at least one micro-lens formed on the at least one color filter color filter, respectively, wherein the micro-lens has a first refractive index equal to or greater than a threshold which is greater than a second refractive index of the at least one color filter, wherein the at least one color filter comprises a plurality of different color filters having respectively different refractive indexes, and wherein the threshold is a sum of a threshold difference and a third refractive index of a color filter, among the plurality of different color filters, which is a highest among the different refractive indexes.

6. The image sensor of claim 1, wherein the micro-lens comprises at least one selected from among metal-added resin, silicon nitride (SiN), plasma silicon oxide (P—SiO), zinc oxide (ZnO), hafnium oxide (HfO), tantalum oxide (TaO), niobium oxide (NbO), zirconium oxide (ZrO), and titanium oxide (TiO).

7. An image sensor module comprising:
the image sensor of claim 1 comprising a plurality of pixels for generating a plurality of pixel signals according to incident light; and
a signal processing circuit configured to output image data based on the plurality of pixel signals.

8. An image processing system comprising:
the image sensor module of claim 7 configured to output the image data; and
a processor configured to process the image data.

9. An image sensor comprising:
a semiconductor substrate in which a photoelectric conversion device is formed;
at least one color filter formed on the semiconductor substrate;
at least one color filter fence formed on the semiconductor substrate and between two neighboring color filters among the at least one color filter; and
at least one micro-lens formed on the at least one color filter, respectively,
wherein the micro-lens has a first refractive index equal to or greater than a first threshold,
wherein the color filter fence has a second refractive index less than or equal to a second threshold,
wherein the second threshold is less than the first threshold.

10. The image sensor of claim 9, wherein the first refractive index is in a first range of 1.8 to 2.5, and
wherein the second refractive index is in a second range of 1.0 to 1.3.

11. The image sensor of claim 9, further comprising:
a first flat layer formed on the at least one color filter and below the micro-lens; and
a second flat layer formed on the semiconductor substrate and below the at least one color filter.

12. The image sensor of claim 11, wherein refractive indexes of the first flat layer the second flat layer are the same as the first refractive index.

13. The image sensor of claim 9, wherein the first refractive index is greater than a refractive index of the at least one color filter, and
wherein the refractive index of the at least one color filter is greater by a threshold difference or more than the second refractive index.

14. The image sensor of claim 13, wherein the threshold difference is in a first range of 0.2 to 0.4, and
wherein the refractive index of the at least one color filter is in a second range of 1.5 to 1.7.

15. The image sensor of claim 9, wherein the color filter fence comprises a porous silica material or an air layer.

16. The image sensor of claim 9, wherein the at least one color filter comprises a plurality of different color filters having respectively different refractive indexes, and
wherein the first threshold is a sum of a first threshold difference and a refractive index of a color filter, among the plurality of different color filters, which is a highest among the different refractive indexes.

17. The image sensor of claim 9, wherein the at least one color filter comprises a plurality of different color filters having respectively different refractive indexes, and
wherein the second threshold is less, by a second threshold difference, than a refractive index of a color filter, among the plurality of color filters, which is a lowest among the different refractive indexes.

18. The image sensor of claim 9, wherein the micro-lens comprises at least one selected from among metal-added resin, silicon nitride (SiN), plasma silicon oxide (P—SiO), zinc oxide (ZnO), hafnium oxide (HfO), tantalum oxide (TaO), niobium oxide (NbO), zirconium oxide (ZrO), and titanium oxide (TiO).

19. An image sensor module comprising:
the image sensor of claim 9 comprising a plurality of pixels for generating a plurality of pixel signals according to incident light; and
a signal processing circuit configured to output image data based on the plurality of pixel signals.

20. An image processing system comprising:
the image sensor module of claim 19 configured to output the image data; and
a processor configured to process the image data.

* * * * *